United States Patent
Ghantasala et al.

(10) Patent No.: US 11,668,553 B2
(45) Date of Patent: Jun. 6, 2023

(54) APPARATUS AND METHOD FOR CONTROLLING EDGE RING VARIATION

(71) Applicant: Applied Materials, Inc., Santa Clara, CA (US)

(72) Inventors: Sathyendra Ghantasala, Fremont, CA (US); Leonid Dorf, San Jose, CA (US); Evgeny Kamenetskiy, Santa Clara, CA (US); Peter Muraoka, Santa Clara, CA (US); Denis M. Koosau, Pleasanton, CA (US); Rajinder Dhindsa, Pleasanton, CA (US); Andreas Schmid, Meyriez (CH)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 17/161,271

(22) Filed: Jan. 28, 2021

(65) Prior Publication Data
US 2021/0254957 A1    Aug. 19, 2021

Related U.S. Application Data

(60) Provisional application No. 62/976,805, filed on Feb. 14, 2020.

(51) Int. Cl.
| | |
|---|---|
| *G01B 7/06* | (2006.01) |
| *H01L 21/67* | (2006.01) |
| *H01J 37/32* | (2006.01) |
| *H01L 21/687* | (2006.01) |

(52) U.S. Cl.
CPC ........... *G01B 7/08* (2013.01); *H01J 37/32642* (2013.01); *H01L 21/67069* (2013.01); *H01L 21/68721* (2013.01); *H01J 2237/24564* (2013.01)

(58) Field of Classification Search
CPC ............... G01B 7/08; H01J 37/32642; H01J 2237/24564; H01L 21/68721
See application file for complete search history.

(56) References Cited

U.S. PATENT DOCUMENTS

| | | | |
|---|---|---|---|
| 9,975,758 B2 | 5/2018 | Tedeschi et al. | |
| 2016/0141154 A1* | 5/2016 | Kamata | G01B 7/08 324/671 |
| 2017/0278735 A1* | 9/2017 | Sugita | H01L 21/6833 |
| 2017/0358431 A1 | 12/2017 | Dorf et al. | |

(Continued)

*Primary Examiner* — Binh X Tran
(74) *Attorney, Agent, or Firm* — Patterson & Sheridan LLP; Keith Taboada

(57) ABSTRACT

Disclosed herein is a method and apparatus for controlling surface characteristics by measuring capacitance of a process kit ring. The method includes interfacing a ring with a jig assembly for measuring capacitance in at least a first location of the ring. The ring has that includes a top surface, a bottom surface, and an inner surface opposite an outer surface. At least the bottom surface has an external coating placed thereon. The method further includes contacting a measuring device to the first location on the outer surface proximate the bottom surface. The measuring device contacts an opening in the external coating to the body. The measuring device contacts a first conductive member that is electrically coupled to the ring. A capacitance is measured on the measuring device. The capacitance across the top surface is measured.

16 Claims, 6 Drawing Sheets

(56) References Cited

U.S. PATENT DOCUMENTS

| | | |
|---|---|---|
| 2019/0172688 A1 | 6/2019 | Ueda |
| 2019/0227669 A1* | 7/2019 | Maharyta ............. H03K 17/962 |
| 2019/0228952 A1 | 7/2019 | Dorf et al. |
| 2019/0346264 A1* | 11/2019 | Kuisma .............. G01C 19/5684 |
| 2020/0118798 A1 | 4/2020 | Luere et al. |
| 2020/0273678 A1* | 8/2020 | Funk ................. H01L 21/67276 |
| 2020/0335368 A1* | 10/2020 | Pan ................... H01L 21/67259 |

* cited by examiner

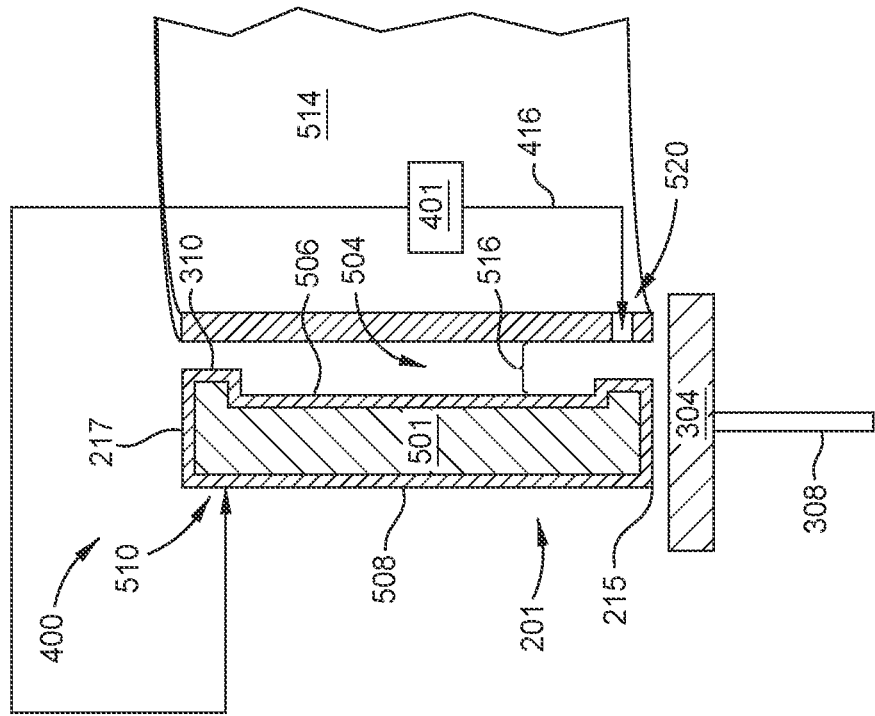
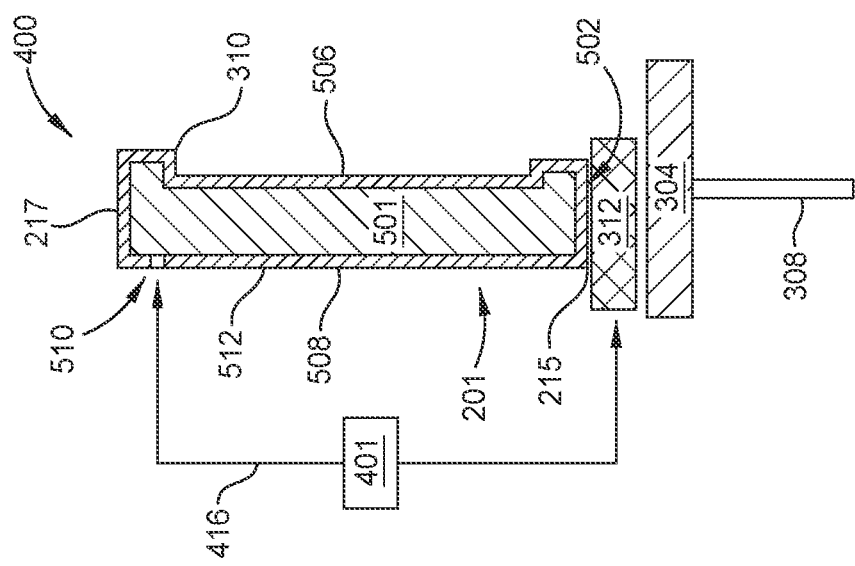
FIG. 5B
FIG. 5A

APPARATUS AND METHOD FOR CONTROLLING EDGE RING VARIATION

CROSS-REFERENCE TO RELATED APPLICATIONS

This application claims benefit of U.S. Provisional Application Ser. No. 62/776,805 filed Feb. 14, 2020, all of which is incorporated by reference in its entirety.

BACKGROUND

Field of Endeavor

Examples described herein generally relate to a method and apparatus for controlling edge ring variation.

Description of the Related Art

In semiconductor processing, a substrate can undergo a variety of plasma processing operations such as deposition, etching, and annealing in plasma processing chambers. In some plasma processing chambers, a ring assembly is utilized to prevent erosion of a substrate support disposed within the processing chamber, and to additionally shape the plasma along the outer periphery of the substrate support in order to form a uniform plasma profile along the top surface of the substrate. During routine maintenance, individual rings of the ring assembly may be replaced as the individual ring becomes worn, and as such, the ring assembly may be very physically different before and after replacement. The physically different ring assembly will cause a change in the plasma profile. Thus, performance of the processing chamber may undesirably be different before and after routine maintenance, which has an adverse effect on processing uniformity, quality and through-put.

Conventional methods for controlling the quality of replacement rings include both mechanical and optical processes. Current control methods to reduce surface variability between subsequent replacement rings can be performed by mechanical measurements such as with the use of calipers or a stylus, i.e., a surface profile gauge. When using the stylus, a tip of the stylus is dragged in contact with the surface of the ring, and as the tip encounters peaks and valleys, the tip is raised and lowered in correspondence with a surface roughness. The amount to which the stylus is raised or lowered at any given point corresponds to the surface roughness.

Other methods for measuring the replacement rings may include non-contact techniques. One non-contact technique includes using interferometry, in which light is projected to the surface of the replacement ring, and differences between an incident and refracted light are compared. Interferometry measures certain characteristics of the waves themselves or of materials that reflect, refract, or transmit the waves to measure small displacements. When two light waves with the same frequency combine, the resulting intensity pattern is determined by the phase difference between the two waves, destructive interference occurs when the light waves that are out of phase. Because the replacement ring is circular and can have irregular groves, conventional measuring techniques can be insufficient to determine a surface characteristic such as roughness, in more than one direction.

These conventional techniques only determine mechanical tolerances of the replacement ring, and are not indicators of process variation. For example, the conventional techniques do not measure any of the electrical properties of the rings. The electrical properties of the rings contribute to the shape of the plasma profile, yet measurements of size, shape surface finish may not be indicative of the electrical properties of the ring, which result in process variation from ring to ring.

Accordingly, there is a need in the art for an improved method and apparatus capable of indicating of process variation of replacement rings.

SUMMARY

Disclosed herein is a method and apparatus for determining surface characteristics by measuring capacitance of a process kit ring. In one example, a method for determining surface characteristics by measuring capacitance of a process kit ring includes interfacing a ring with a jig assembly for measuring capacitance in at least a first location of the ring. The ring has a top surface, a bottom surface, and an inner surface opposite an outer surface. At least the bottom surface has an external coating placed thereon. The method further includes contacting a measuring device to a first location on the outer surface proximate the bottom surface. The measuring device contacts an opening in the external coating to the body. The measuring device contacts a first conductive member that is electrically coupled to the ring. A capacitance is measured on the measuring device. The capacitance across the top surface is measured.

In another example, a method of setting a ring capacitance is disclosed. The method includes interfacing a ring with a jig assembly for measuring capacitance in at least a first location of the ring. The ring has a top surface and a bottom surface, and an inner surface opposite an outer surface. A first thickness is defined by a difference between the inner surface and the outer surface. A second thickness is defined by a difference between the top surface and the bottom surface. At least the bottom surface has an external coating placed thereon. The method includes contacting a measuring device to a first location on the outer surface proximate the bottom surface. The measuring device contacts an opening in the external coating of the body. The method further includes contacting the measuring device to a first conductive member electrically coupled to the ring. A capacitance is measured to determine if the capacitance is within a threshold. Upon determining the measured capacitance is outside the threshold, one or more of the first thickness or the second thickness of the ring is altered.

In another example, an apparatus for measuring a ring capacitance includes a clamp configured to contact an inner surface and an outer surface of a ring. The clamp has a body that includes a first end having a first hole. A second end has a second hole. A middle portion is disposed between the first end and the second end. The middle portion has a third hole. A first positioning member is disposed in the first hole. A second positioning member extends through the third hole. A first electrode is coupled to the first alignment member. A conductive member is configured to support the ring along a top surface of the ring. A support surface of the apparatus supports the conductive member. The support surface supports a measuring device coupled to the conductive member and the first electrode. The measuring device is configured to measure a capacitance of the ring.

BRIEF DESCRIPTION OF THE DRAWINGS

So that the above recited features of the present disclosure can be understood in detail, a more particular description of the disclosure, briefly summarized above, may be had by reference to examples herein, some of which are illustrated in the appended drawings. However, it is to be noted that the appended drawings illustrate only examples and are therefore not to be considered limiting of the disclosure's scope. Accordingly, the appending drawings admit to other equally effective examples.

FIG. 5A is a schematic side view illustrating capacitance measurement of a surface of the sliding ring using the measurement jig assembly of FIG. 3.

FIG. 5B is a schematic side view illustrating capacitance measurement of an inner surface of the sliding ring using the measurement jig assembly of FIG. 3.

In order to facilitate understanding, identical reference numerals have been used, where possible, to designate identical elements that are common features. It is contemplated that elements and features of one example may be beneficially incorporated into other examples without further recitation.

DETAILED DESCRIPTION

Examples disclosed herein generally relate to a method and apparatus for controlling process performance characteristics of a process ring kit by measuring a capacitance of the process kit ring. The process kit may include at least an edge ring and a sliding ring. A surface of a sliding ring of the process kit may be coated with a material in order to improve longevity and surface uniformity. For example, the surface may be anodized. Uniform surfaces of the sliding ring enable consistent RF power coupling across multiple process runs. The uniform surfaces of the sliding ring also enable consistent RF coupling within the processing chamber. Additionally, uniform surfaces of the sliding ring also enable consistent RF coupling across multiple processing chambers where the same type of sliding ring is used. Disclosed herein, is a method and apparatus for determining the consistency of processing performance of the sliding ring by measuring a capacitance across a given surface of the sliding ring.

It has been determined that capacitance can be used as a metric for determining process uniformity between sliding rings. Variability in capacitance between a current sliding ring and a replacement sliding ring may lead to performance mismatch. In an electrostatic chuck (ESC), the bias RF power is capacitively coupled across a cooling base to the sliding ring, and capacitively coupled across the sliding ring to the edge ring. The capacitance (C1) between the cooling base to the sliding ring and the capacitance (C2) between the sliding ring and the edge ring impact the RF power coupling. It is therefore advantageous to control C1 and C2 carefully in order to enable consistent RF power coupling across chambers, particularly after one or both of the rings have been replaced or serviced. A difference in the measured capacitance, C1 or C2, outside of a given tolerance, affects the performance of the replacement sliding ring in the processing chamber often results in a non-uniform plasma profile between process runs or different processing chambers. The difference in the measured capacitance at C1 or C2 can be compared to a threshold range. The threshold range can be an ideal capacitance range that ensures the replaced sliding ring is consistent and conforms to specification parameters to provide a consistent RF coupling. Advantageously, ascertaining the capacitance of the sliding ring surfaces corresponds to uniform performance for replacement sliding rings. By maintaining uniform sliding rings, a consistent RF power coupling is enabled across multiple process runs or between multiple processing chambers. If the capacitance of the sliding ring does not fall within allowed tolerance, the sliding ring can either be reworked (e.g., polished) to meet specification capacitance parameters, or removed from service if the sliding ring is out of specification.

Figure 1:
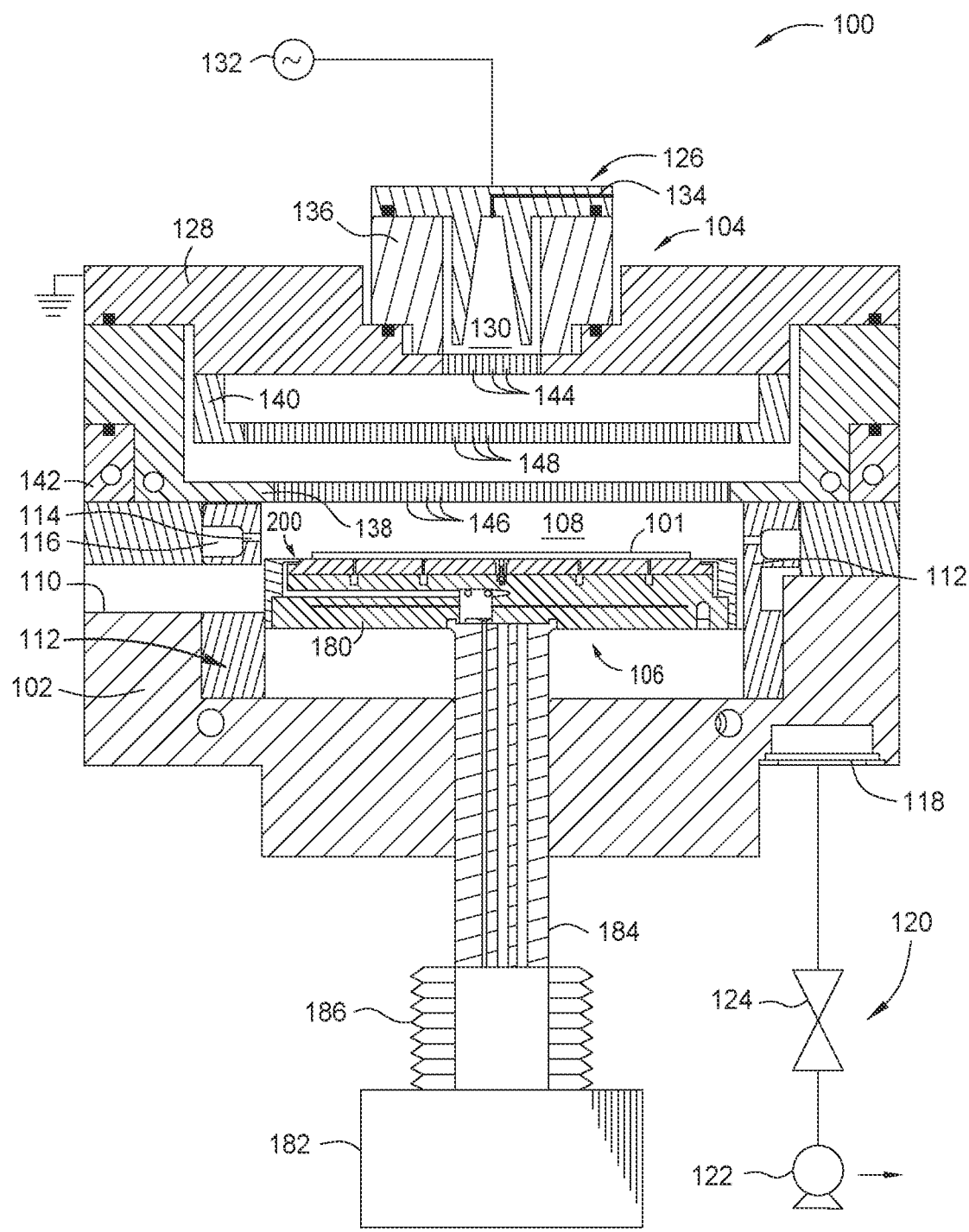
FIG. 1 is a cross sectional view of a processing chamber having a process kit, according to one example.

FIG. 1 is a cross sectional view of the processing chamber 100 having a process kit 200, according to one example. As shown, the processing chamber 100 is an etch chamber suitable for etching a substrate 101. Examples of processing chambers that may be adapted to benefit from the disclosure are CENTRIS® SYM3® Etch Processing System, commercially available from Applied Materials, Inc., located in Santa Clara, Calif. It is contemplated that other processing chamber, including deposition chambers and those from other manufacturers, may be adapted to benefit from the disclosure.

The processing chamber 100 may be used for various plasma processes. In one example, the processing chamber 100 may be used to perform dry etching with one or more etching agents (i.e., processing gases). For example, the processing chamber may be used for ignition of plasma from a processing gases including $C_xF_y$ (where x and y can integers from about 1 to 10 that indicate different allowed combinations of CF), $O_2$, $NF_3$, or combinations thereof.

The processing chamber 100 includes a chamber body 102, a lid assembly 104, and a support assembly 106. The lid assembly 104 is positioned at an upper end of the chamber body 102. The support assembly 106 is disclosed in an interior volume 108, defined by the chamber body 102. The chamber body 102 includes a slit valve opening 110 formed in a sidewall thereof. The slit valve opening 110 is selectively opened and closed to allow access to the interior volume 108 by a substrate handling robot (not shown).

The chamber body 102 may further include a liner 112 that surrounds the support assembly 106. The liner 112 is removable for servicing and cleaning. The liner 112 may be made of a metal such as aluminum, a ceramic material, or any other process compatible material. In one or more examples, the liner 112 includes one or more apertures 114 and a pumping channel 116 formed therein that is in fluid communication with a vacuum port 118. The apertures 114 provide a flow path for gases into the pumping channel 116. The pumping channel 116 provides an egress for the gases within the processing chamber 100 to vacuum port 118.

A vacuum system 120 is coupled to the vacuum port 118. The vacuum system 120 may include a vacuum pump 122 and a throttle valve 124. The throttle valve 124 regulates the flow of gases through the processing chamber 100. The vacuum pump 122 is coupled to the vacuum port 118 that is fluidly coupled to the interior volume 108.

The lid assembly 104 includes at least two stacked components configured to form a plasma volume or cavity therebetween. In one or more examples, the lid assembly 104 includes an upper electrode 126 disposed vertically above a lower electrode 128. The upper electrode 126 and the lower electrode 128 confine a plasma cavity 130, therebetween. The upper electrode 126 is coupled to a power source 132, such as an RF power supply. The lower electrode 128 is connected to ground, forming a capacitance between the upper electrodes 126 and lower electrode 128. The upper electrode 126 is in fluid communication with a gas inlet 134. A first end of the one or more gas inlets 134 opens into the plasma cavity 130.

The lid assembly 104 may also include an isolator ring 136 that electrically isolates the upper electrode 126 from the lower electrode 128. The isolator ring 136 may be made from aluminum oxide or any other insulative, processing compatible material.

The lid assembly 104 may also include a gas distribution plate 138 and a blocker plate 140. The lower electrode 128, the gas distribution plate 138, and the blocker plate 140 may be stacked and disposed on a lid rim 142, which is coupled to the chamber body 102.

In one or more examples, the lower electrode 128 may include a plurality of gas passages 144 formed beneath the plasma cavity 130 to allow gas from the plasma cavity 130 to flow therethrough. The gas distribution plate 138 includes a plurality of apertures 146 configured to distribute the flow of gases therethrough. The blocker plate 140 can be disposed between the lower electrode 128 and the gas distribution plate 138. The blocker plate 140 includes a plurality of apertures 148 to provide a plurality of gas passages from the lower electrode 128 to the gas distribution plate 138.

The support assembly 106 may include a substrate support 180. The substrate support 180 is configured to support the substrate 101 for processing. The substrate support 180 may be coupled to a lift mechanism 182 through a shaft 184, which extends through a bottom surface of the chamber body 102. The lift mechanism 182 may be flexibly sealed to the chamber body 102 by a bellows 186 that prevents vacuum leakage from around the shaft 184. The lift mechanism 182 allows the substrate support 180 to be moved vertically within the chamber body 102 between a lower transfer portion and a number of raised process positions.

Figure 2:
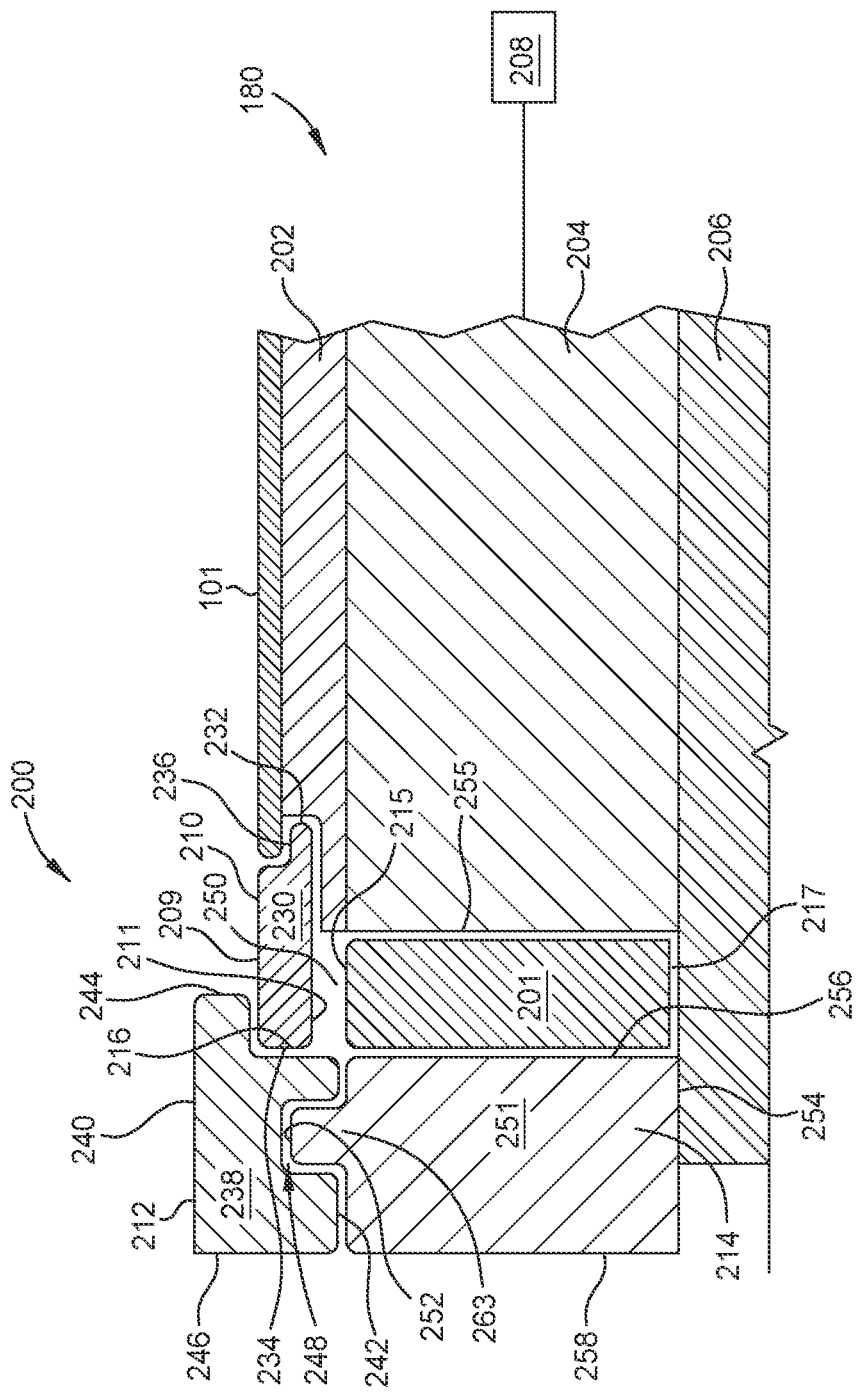
FIG. 2 is a partial cross sectional view of a portion of the substrate support having the process kit, according to one example.

FIG. 2 is a partial cross sectional view of a portion of the substrate support 180 having the process kit 200, according to one example. The substrate support 180 includes an electrostatic chuck 202, a cooling plate 204, and a base 206. In at least one example, the base 206 is a cathode. The cooling plate 204 is disposed on the base 206. The cooling plate 204 may include a plurality of cooling channels (not shown) for circulating coolant therethrough. The cooling plate 204 may be secured to the electrostatic chuck 202 by an adhesive or any suitable mechanism. One or more power supplies 208 may be coupled to the base 206. The electrostatic chuck 202 may include one or more heaters (not shown). The one or more heaters may be independently controllable. The one or more heaters enable the electrostatic chuck 202 to heat the substrate 101 from a bottom surface of the substrate 101 to a desired temperature.

The process kit 200 is disposed on the substrate support 180 (shown in FIG. 1). The process kit 200 may include an edge ring 210, a cover ring 212, a quartz ring 214 and a sliding ring 201. The edge ring 210 has an annular body 230. The annular body 230 includes a top surface 209, a bottom surface 211, and inner edge 232, and an outer edge 234. The top surface 209 is substantially parallel to the bottom surface 211. The inner edge 232 is substantially parallel to the outer edge 234, and substantially perpendicular to the bottom surface 211. The annular body 230 further includes a stepped surface 236. The stepped surface 236 is formed in the inner edge 232, such that the stepped surface 236 is substantially parallel to the bottom surface 211. The stepped surface 236 defines a recess for receiving the substrate 101. The edge ring 210 is adapted to cover an outer perimeter of the substrate support 180 and protect the substrate support 180 from deposition and damage from exposure to the plasma.

The cover ring 212 includes an annular body 238 having a top surface 240, bottom surface 242, inner edge 244, and outer edge 246. The top surface 240 is substantially parallel to the bottom surface 242. The inner edge 244 is substantially parallel to the outer edge 246, and substantially perpendicular to the bottom surface 242. In the example shown in FIG. 2, a notch 248 is formed in the bottom surface 242 of the annular body 238. The quartz ring 214 is disposed adjacent the substrate support 180. The quartz ring 214 includes an annular body 251 having a top surface 252, bottom surface 254, inner edge 256, and outer edge 258. The quartz ring 214 is configured to support the cover ring 212 in the processing chamber 100. For example, in the example shown, the quartz ring 214 supports the cover ring 212 from the bottom surface 242 of the cover ring 212. In some examples, the quartz ring 214 may include a protruding member 263. The protruding member 263 protrudes from the top surface 252 of the quartz ring 214. The protruding member 263 is configured to mate with the notch 248 formed in the bottom surface 242 of the cover ring 212. The cover ring 212 is positioned along an outside perimeter 216 of the edge ring 210. The edge ring 210 is configured to block particles from slipping beneath the edge ring 210.

The sliding ring 201 has a top surface 215 and a bottom surface 217. The sliding ring 201 may be formed from a conductive material, such as aluminum. The sliding ring 201 is disposed beneath the edge ring 210, between the quartz ring 214 and the substrate support 180, forming a gap 250. For example, in one example, the sliding ring 201 extends down past the electrostatic chuck 202, alongside the cooling plate 204. In one example, the sliding ring 201 has a height that extends all the way to the bottom of the cooling plate 204. As such, the sliding ring 201 is able to couple power from the cooling plate 204 to the edge ring 210. The sliding ring 201 may circumscribe the cooling plate 204, thus forming a laterally spaced gap 255. In one example, the laterally spaced gap 255 is greater than about 0 inches and less than or equal to 0.03 inches. In one example, the sliding ring 201 may be moved between greater than about 0 mm and less than or equal to 4 mm vertically, for example, between about 2 mm and about 4 mm. Moving the sliding ring 201 vertically changes the RF power coupling with the edge ring 210.

Figure 3:
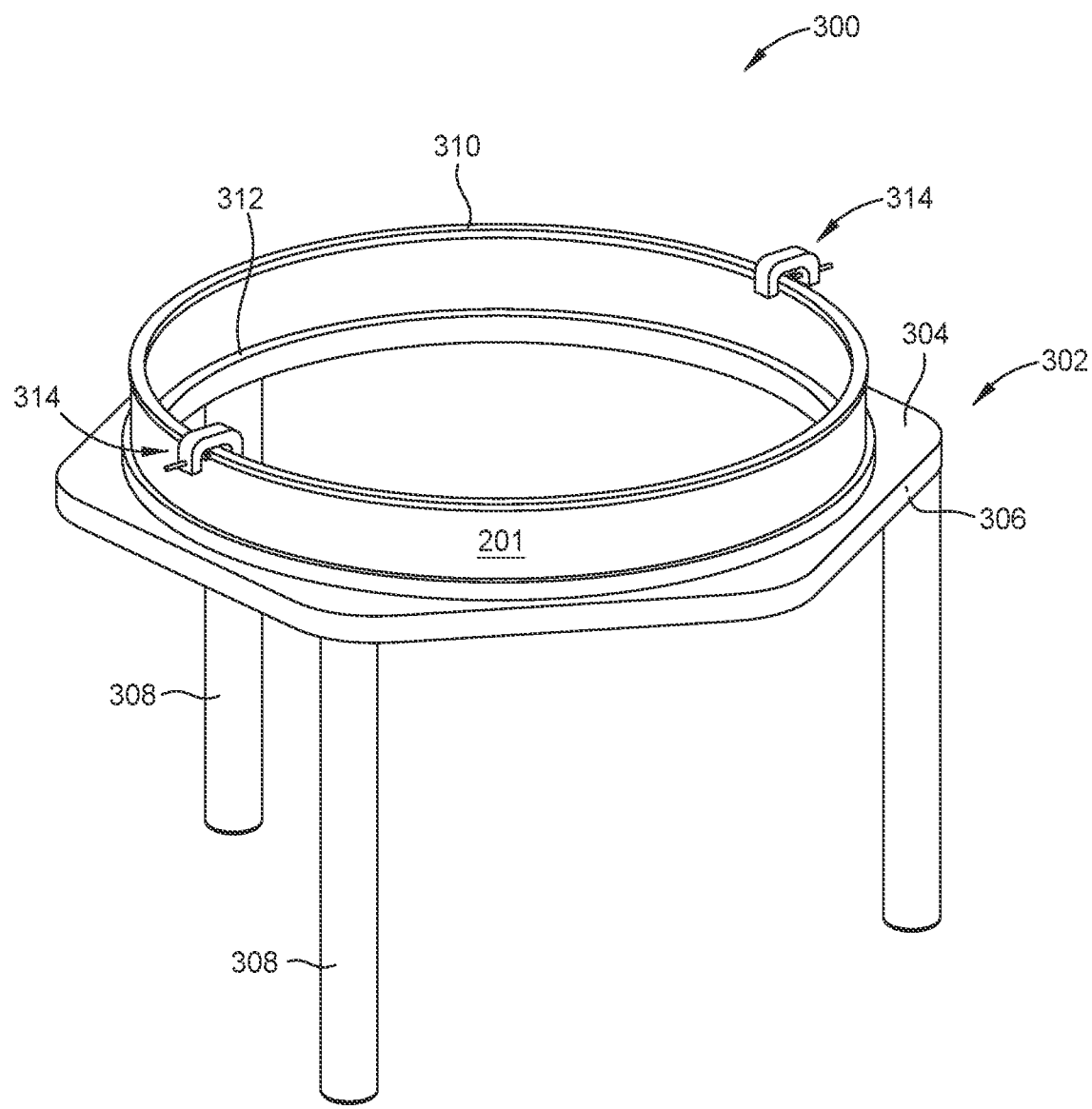
FIG. 3 is an orthogonal view of a measurement jig assembly configured to support and measure capacitance of a sliding ring of the process kit illustrated in FIG. 2.

FIG. 3 is an orthogonal view of a measurement jig assembly 300 configured to support and measure capacitance of the sliding ring 201 of the process kit 200 illustrated in FIG. 2. The measurement jig assembly 300 includes a support surface 302 that has a top face 304 and bottom face 306. A plurality of supports 308, i.e., legs, extend from the bottom face 306 of the support surface 302 to the ground.

The sliding ring 201 as illustrated in FIG. 3 is upside down with respect to the orientation of the sliding ring 201 depicted in FIG. 2. An external coating 310 covers the bottom surface 217 of the sliding ring 201. The external coating 310 increases resistance to corrosion and wear of the bottom surface 217 of the sliding ring 201. In at least one example, the external coating 310 is an oxide. In one configuration, the external coating 310 is an anodized aluminum. The measurement jig assembly 300 enables the sliding ring 201 to be placed on support surface 302 such that laterally spaced gap 255 between cooling plate 204 and the sliding ring 201 is replicated. Additionally, the gap 250 between the sliding ring 201 and annular body 230 can also replicated by the measurement jig assembly 300.

As shown, the support surface 302 has a hexagonal shape, but is not limited to that shape. The support surface 302 can be any shape that is capable of supporting the sliding ring 201. For example, the support surface 302 may be a parallelogram. In another example, the support surface 302 is circular or oval. The support surface 302 may be made from a material that includes plastic, wood, or other non-conductive material. In one example, the material may include acetal.

The plurality of supports 308 may include three legs, as illustrated in FIG. 3. However, the number of legs in the plurality of supports 308 is not limited to three. The plurality of supports 308 can include odd or even numbers of legs, such that the plurality of supports 308 are equidistantly arranged and are capable of supporting the support surface 302. The plurality of supports 308 may be made from a material that includes wood, metal, or plastic, such as polytetrafluoroethylene (PTFE).

A bottom conductive member 312 of the support surface 302 supports the sliding ring 201. The top surface 215 is in contact with the bottom conductive member 312, when the sliding ring 201 is positioned on the support surface 302. The bottom conductive member 312 may be made from a conductive material such as aluminum.

A holder 314 is configured to couple to the bottom surface 217 of the sliding ring 201. The holder 314 is configured to enable measurement of a capacitance of the sliding ring 201. The holder 314 is made of a non-conductive material. The material can be glass, PTFE, or a combination of both.

Figure 4:
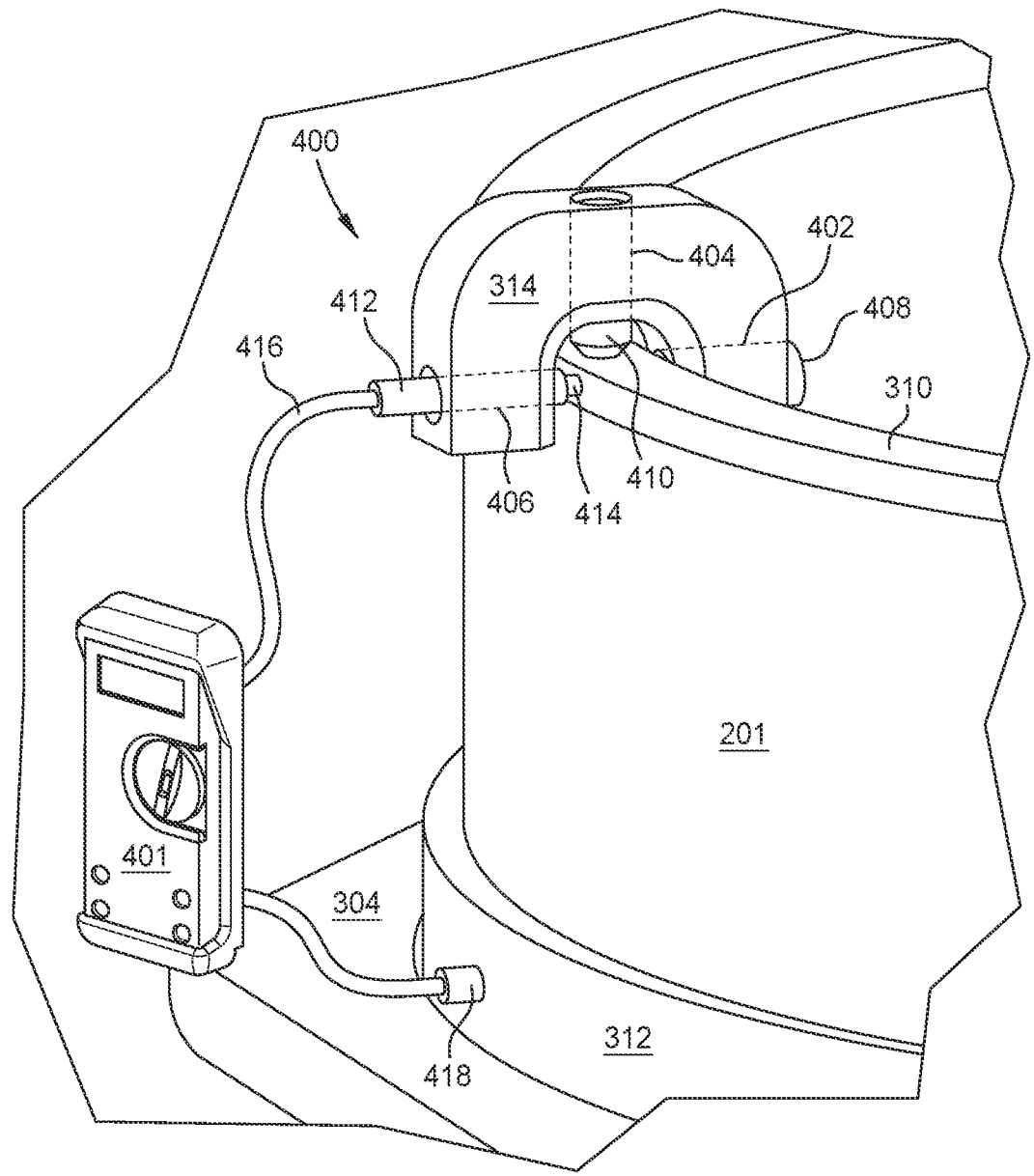
FIG. 4 is a partial orthogonal view for a capacitance measuring system of the measurement jig assembly.

FIG. 4 is a partial orthogonal view for a capacitance measuring system 400 of the measurement jig assembly 300. The capacitance measuring system 400 includes a measuring device 401 and the holder 314. The holder 314 is mounted on the sliding ring 201. The holder 314 includes a first through hole 402, a second through hole 404, and a third through hole 406. The second through hole 404 is substantially orthogonal to the first through hole 402 and the third through hole 406. A center line of the first through hole 402 is substantially co-axial to a center line of the third through hole 406. Accordingly, the first through hole 402 and third through hole 406 are co-axial. In another example, an interior surface of each of the first through hole 402 and second through hole 404 is threaded. The first through hole 402 is disposed in a first end of the holder 314. The second through hole 404 is disposed in a middle portion of the holder 314. The third through hole 406 is disposed in a second end of the holder 314.

A first positioning member 408 contacts the external coating 310 by passing through the first through hole 402. The second positioning member 410 passes through the second through hole 404 in order to contact the external coating 310. The first position member 408 and the second position member 410 may be screws, bolts, or pins. In at least one example, the first position member 408 and second positioning member 410 are threaded screws. In this example, the threaded screws correspond to, i.e., engages a threaded surface on the interior of each of the first through hole 402 and second through hole 404. In another example, the first positioning member 408 and second positioning member 410 are biased pins, each positioning member 408, 410 (i.e., positioning members) being biased toward the external coating 310. In some configuration, the first positioning member 408 and the second positioning member 410 are biased with a spring. The spring may be on an internal portion of the first positioning member 408 and the second positioning member 410.

A connector 412 passes through the third through hole 406 to contact the sliding ring 201. Herein, the measuring device 401 may be a capacitance meter. The measuring device 401 is electrically coupled to the sliding ring 201 via the connector 412. A first electrode 414 is positioned at an end of the connector 412. The first electrode 414 is configured to come into contact with an opening in the external coating 310, as described below. The sliding ring 201 is electrically coupled to the measuring device 401 through the first electrode 414 of the connector 412. In one configuration, the connector 412 may be spring loaded enabling the first electrode 414 to come into pressing contact with the sliding ring 201. Accordingly, the connector 412 and the first electrode 414 can be biased toward the sliding ring 201. In another example, the connector 412 is threaded, for example, an eternal surface of connector 412 is threaded. The external surface of the connector 412 corresponds a threaded surface on the interior of the third through hole 406. An angle of the holder 314 can be aligned, adjusted, or tilted with respect to external coating 310 of the sliding ring 201 adjusting the holder 314 by changing a position of one or more of the positioning members 408, 410.

A second electrode 418 electrically couples the bottom conductive member 312 to the measuring device 401. A wiring 416 enables electrical current to be transmitted and received from each of the first electrode 414 and second electrode 418 to the measuring device 401. In this configuration, the measuring device 401 can determine a capacitance of a measured surface of the sliding ring 201. As such, in one example, the capacitance between the top surface 215 and the bottom surface 217 is measured. In another example, the second positioning member 410 can be used alone with the connector 412 to secure the holder 314 to the sliding ring 201. Alternatively, the first positioning member 408 can be used alone with the connector 412 to secure the holder 314 to the sliding ring 201.

FIG. 5A is a schematic side view illustrating capacitance measurement of the top surface 215 of the sliding ring 201 using the measurement jig assembly 300 of FIG. 3. The capacitance measuring system 400 is shown without the holder 314 in order to demonstrate certain details of the capacitance measuring system 400. The sliding ring 201 illustrated in FIGS. 5A-B is upside down with respect to the orientation of the sliding ring 201 depicted in FIG. 2

A body 501 of the sliding ring 201 includes the top surface 215 and a bottom surface 217 opposite the top surface 215. An inner surface 506 is opposite an outer surface 508 of the sliding ring 201. As described above, the external coating 310 extends over the bottom surface 217 to cover a portion of the inner surface 506. Additionally, the external coating 310 extends over the bottom surface 217 to cover a portion of the outer surface 508. A surface coating 512 surrounds the top surface 215 and a portion of the inner surface 506 and the outer surface 508 of the sliding ring 201. The surface coating 512 covers a greater portion of the inner surface 506 and the outer surface 508 than does the external coating 310. In one example, the surface coating 512 may be a ceramic coating or other protective coating. In another example, the surface coating 512 may be a yttria oxide coating or a gel-like coating. The surface coating 512 limits the chemical reaction between the plasma and the sliding ring 201 and thus limits particle creation and ring damage. As noted above, the measuring device 401 can determine the capacitance of the measured surface of the sliding ring 201. The measurement jig assembly 300 can be configured to measure the capacitance across different surfaces of the sliding ring 201. In one configuration, the capacitance between the inner surface 506 and the outer surface 508 is measured.

An opening 510 is provided in the external coating 310. The opening 510 exposes a surface of the sliding ring 201. The exposed surface of the sliding ring 201 is a surface of the sliding ring 201 that is not covered with the external coating 310 or surface coating 512. In one configuration, the opening 510 exposes a bare aluminum spot the body 501 of the sliding ring 201. The first electrode 414 is configured to contact the sliding ring 201 through the opening 510.

FIG. 5B is a schematic side view illustrating capacitance measurement of the inner surface 506 of the sliding ring 201 using the measurement jig assembly 300 of FIG. 3. An inner conductive member 514 is positioned on the inner surface 506 of the sliding ring 201.

A first capacitance 502, shown in FIG. 5A, is measured across the top surface 215 of the sliding ring 201. Returning to FIG. 5B, A second capacitance 504 is measured across the inner surface 506 of the sliding ring 201. As shown in FIG. 2, when the sliding ring 201 is mounted within the process kit 200, RF power is capacitively coupled across cooling plate 204 to the sliding ring 201. The RF power is also capacitively coupled across the sliding ring 201 and the bottom conductive member 312. The bottom conductive member 312 corresponds to annular body 230. The first capacitance 502 corresponds (i.e., is proportional) to a capacitance between the annular body 230 and the sliding ring 201. The second capacitance 504 corresponds (i.e., is proportional) to a capacitance between the sliding ring 201 and the cooling plate 204. Advantageously, utilizing the first capacitance 502 and second capacitance 504 enable consistent performance of the sliding ring 201 for coupling the RF power, and provides a consistent plasma profile from one sliding ring 201 to a replacement sliding ring (not shown). Accordingly, RF power coupling across multiple process runs or multiple chambers is enabled.

Figure 6:
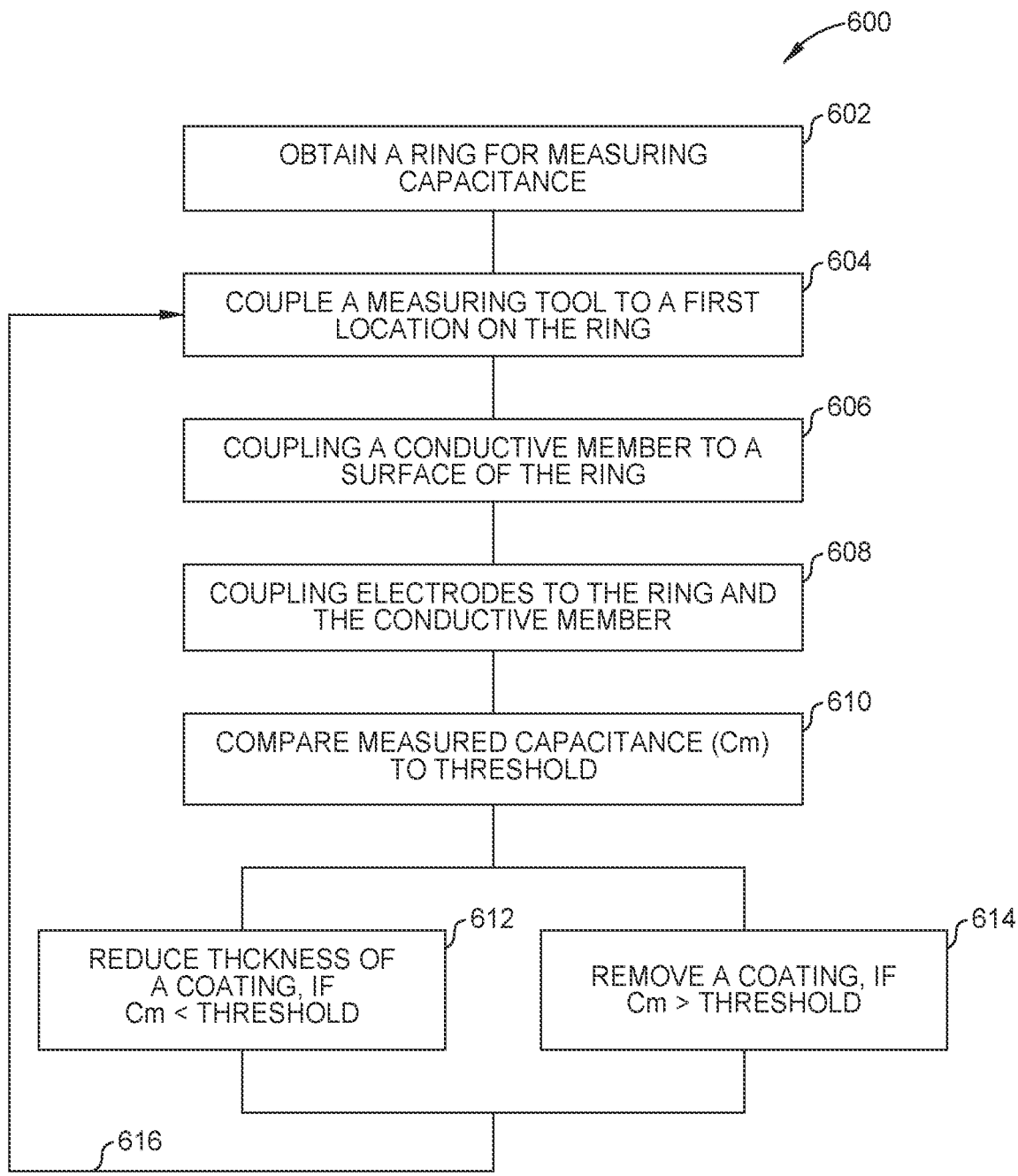
FIG. 6 is a flow diagram of the method for measuring the capacitance of the sliding ring as shown in FIGS. 5A and 5B.

FIG. 6 is a flow diagram of the method of measuring the capacitance of the sliding ring 201 as shown in FIGS. 5A and 5B. At block 602, a sliding ring 201 is obtained. The sliding ring 201 is obtained for measuring a capacitance in a first location. In at least one example, the first location is the opening 510. A first thickness is defined by a difference between the inner surface 506 and the outer surface 508. Stated differently, the first thickness is the width of the sliding ring 201. A second thickness is defined by a difference between the top surface 215 and the bottom surface 217. The second thickness is the height of the sliding ring 201.

At block 604, the holder 314 is coupled proximate the opening 510 in the bottom surface 217. The holder 314 is coupled to the bottom surface 217 such that third through hole 406 aligns with the opening 510 in the external coating 310 of the body.

At block 606, the bottom conductive member 312 is coupled to the top surface 215. At block 608, the first electrode 414 is passed through and coupled to the holder 314. As shown in FIG. 4, the connector 412 of the first electrode 414 passes through the third through hole 406 to contact the bottom surface 217. The first electrode 414 is coupled to the measuring device 401. The second electrode 418 is coupled from the measuring device 401 to the bottom conductive member 312. Alternately, the first electrode 414 may be coupled to the inner conductive member 514, illustrated in FIG. 5. In at least one example, the second electrode 418 is coupled to the bottom conductive member 312 by utilizing a screw.

An air gap 516 is proved between the inner conductive member 514 and the inner surface 506 including the external coating 310. The air gap 516 is between about 30 mm and about 5 mm, but is not limited to this distance. The air gap 516 may facilitate removal of the inner conductive member 514 from the measurement jig assembly 300. In an alternative example, the inner conductive member 514 may be placed in direct contact with the inner surface 506, such that the air gap 516 is between about 0 mm and about 5 mm, such as about 0 mm, or less than 0.5 mm.

Referring to FIGS. 4-5B, the second electrode 418 is coupled to the inner conductive member 514 in substantially the same manner as the second electrode 418 couples to the bottom conductive member 312. In one example, the second electrode 418 is coupled to a hole 520 in the inner conductive member 514. As illustrated, the hole 520 is shown towards the bottom of the inner conductive member 514, but the hole 520 can be located at other positions on the inner conductive member 514.

At block 610, the first capacitance 502 or the second capacitance 504 is obtained as a measured capacitance $C_m$. Either the first capacitance 502 or the second capacitance 504, as the measured capacitance $C_m$, is compared to a threshold $C_{th}$. The first capacitance 502 being measured using the capacitance measuring system 400. The second capacitance 504 being measured using the inner conductive member 514.

At block 612, the thickness of external coating 310 of the sliding ring 201 may be reduced. In addition, the thickness of the surface coating 512 of the sliding ring 201 may be reduced. Accordingly, the first thickness or the second thickness of the sliding ring 201 may be reduced, if the measured capacitance $C_m$ is below the threshold $C_{th}$. The first thickness is reduced if the external coating 310 is reduced. The second thickness is reduced if the surface coating 512 is reduced. The threshold $C_{th}$ may be based upon an ideal value that corresponds to the specification parameter. Alternatively, threshold $C_{th}$ may be based upon an acceptable capacitance. In another example, the threshold $C_{th}$ may be based upon a thickness of either the external coating 310 or the surface coating 512 as well as the material body of the sliding ring 201.

At block 614, the external coating 310 may be removed, if the measured capacitance $C_m$ is above the threshold $C_{th}$. At block 616, the method 600 returns to block 604. The measuring device 401 may again be coupled to the opening 510 to verify the measured capacitance $C_m$. In another example, the measuring device 401 may be coupled to a different opening 510 on a different portion of the external coating 310. If the measured capacitance $C_m$ deviates from threshold $C_{th}$, the sliding ring 201 can be polished with a polishing tool (not shown) in order to change the thickness, and thus the capacitance, of the sliding ring 201. After polishing the external coating 310 or the surface coating 512, the measured capacitance $C_m$ may be measured again, according to the method 600 disclosed herein. If the measured capacitance $C_m$ remains outside the threshold $C_{th}$, the sliding ring 201 may be rejected or reworked again as described in block 614.

Examples disclosed herein generally relate to a method and apparatus for inspecting a process kit ring by measuring the capacitance of different surfaces of the process kit ring. Advantageously, ascertaining the capacitance of the surfaces of the sliding ring enables to uniform performance of

What we claim is:

1. A method of measuring a ring capacitance, the method comprising:
   interfacing a ring with a jig assembly for measuring capacitance of the ring, the ring having a body, the body comprising:
      a top surface, a bottom surface, and an inner surface opposite an outer surface, wherein at least the bottom surface and a portion of the outer surface have an external coating;
   contacting a measuring device to a first location on the outer surface proximate the bottom surface, wherein the measuring device contacts an opening in the external coating to the body;
   contacting the measuring device to a first conductive member electrically coupled to the top surface of the ring; and
   measuring a capacitance using the measuring device between the first location on the outer surface proximate the bottom surface and the first conductive member.

2. The method recited in claim 1, further comprising:
   positioning the first conductive member on a support surface, the support surface comprising:
      a top face and a bottom face, the top face configured to support the ring, and
      a plurality of supports is coupled to the bottom face of the support surface.

3. The method recited in claim 1, further comprising:
   positioning a second conductive member electrically coupled with the inner surface, contacting the measuring device to the second conductive member configured to measure a second capacitance between the first location on the outer surface proximate the bottom surface and the second conductive member.

4. The method recited in claim 3, further comprising:
   positioning an insulator between the second conductive member and the first conductive member, the insulator in contact with both of the first conductive member and the second conductive member.

5. The method recited in claim 1, further comprising:
   electrically coupling the measuring device to the first location on the outer surface proximate the bottom surface, wherein the measuring device extends through an opening in the external coating to the body; and
   aligning the measuring device with a first positioning member, the first positioning member configured to align an angle of the measuring device with respect to the inner surface.

6. The method recited in claim 5, further comprising:
   aligning the measuring device with a second positioning member, the second positioning member configured to abut the bottom surface.

7. The method recited in claim 6, wherein the first positioning member passes through a first aligning hole, the second positioning member passes through a second aligning hole, and the first positioning member is positioned substantially orthogonal to the second positioning member.

8. A method of setting a ring capacitance, the method comprising:
   interfacing a ring with a jig assembly for measuring capacitance of the ring, the ring having a body, the body comprising:
      a top surface and a bottom surface, and an inner surface opposite an outer surface, a first thickness defined by a difference between the inner surface and the outer surface, and a second thickness defined by a difference between the top surface and the bottom surface, wherein at least the bottom surface and a portion of the outer surface have an external coating;
   contacting a measuring device to a first location on the outer surface proximate the bottom surface, wherein the measuring device contacts an opening in the external coating to the body;
   contacting the measuring device to a first conductive member electrically coupled to the ring;
   measuring a capacitance to determine if the capacitance is within a threshold; and
   upon determining the measured capacitance is outside the threshold, altering one or more of the first thickness or the second thickness of the ring.

9. The method recited in claim 8, altering one or more of the first thickness or the second thickness of the ring comprises:
   reducing the first thickness or the second thickness of the ring, if the measured capacitance is below the threshold.

10. The method recited in claim 8, altering one or more of the first thickness or the second thickness of the ring comprises:
    removing the external coating, if the measured capacitance is above the threshold.

11. The method recited in claim 8, further comprising:
    electrically coupling the measuring device to the first location on the outer surface proximate the bottom surface, wherein the measuring device extends through an opening in the external coating to the body; and
    aligning the measuring device with a first positioning member, the first positioning member configured to align an angle of the measuring device with respect to the inner surface.

12. The method recited in claim 11, further comprising:
    aligning the measuring device with a second positioning member, the second positioning member configured to abut the bottom surface.

13. The method recited in claim 12, wherein the first positioning member passes through a first aligning hole, the second positioning member passes through a second aligning hole, and the first positioning member is positioned substantially orthogonal to the second positioning member.

14. The method recited in claim 8, further comprising:
    positioning the first conductive member on a support surface, the support surface comprising:
       a top face and a bottom face, the top face configured to support the first conductive member supporting the ring, and
       a plurality of supports is coupled to the bottom face of the support surface.

15. The method recited in claim 14, further comprising:
    positioning a second conductive member electrically coupled with the inner surface, contacting the measuring device to the second conductive member configured to measure a second capacitance between the first location on the outer surface proximate the bottom surface and the second conductive member.

16. The method recited in claim 15, further comprising:
    positioning an insulator between the second conductive member and the first conductive member, the insulator in contact with both of the first conductive member and the second conductive member.

* * * * *